(12) United States Patent
Tramet et al.

(10) Patent No.: US 9,485,893 B2
(45) Date of Patent: Nov. 1, 2016

(54) ELECTRICAL SYSTEM WITH SHIELDING

(71) Applicant: Valeo Systemes de Controle Moteur, Cergy Pontoise (FR)

(72) Inventors: Guillaume Tramet, Montesson (FR); Jean-Baptiste Colonges, Dompierre sur Veyle (FR)

(73) Assignee: Valeo Systemes de Controle Moteur, Cergy Pontoise (FR)

( * ) Notice: Subject to any disclaimer, the term of this patent is extended or adjusted under 35 U.S.C. 154(b) by 2 days.

(21) Appl. No.: 14/703,226

(22) Filed: May 4, 2015

(65) Prior Publication Data

US 2015/0319890 A1 Nov. 5, 2015

(30) Foreign Application Priority Data

May 5, 2014 (FR) ...................................... 14 54067

(51) Int. Cl.
*H05K 9/00* (2006.01)
*H05K 7/14* (2006.01)

(52) U.S. Cl.
CPC .............. *H05K 9/0022* (2013.01); *H05K 7/14* (2013.01); *H05K 9/0028* (2013.01)

(58) Field of Classification Search
CPC .................... H01L 23/552; H05K 2201/0707; H05K 2201/10371; H05K 9/0022; H05K 9/0024; H05K 9/0052; H05K 9/0071; H05K 9/0081

See application file for complete search history.

(56) References Cited

U.S. PATENT DOCUMENTS

| | | | | |
|---|---|---|---|---|
| 5,016,086 A | * | 5/1991 | Inoue ............... | G06K 19/07743 174/541 |
| 5,031,076 A | * | 7/1991 | Kiku .................... | H05K 9/0067 361/725 |
| 5,519,577 A | * | 5/1996 | Dudas ................. | H05K 1/0218 174/350 |
| 5,896,274 A | * | 4/1999 | Ishida ................ | H01R 23/6873 361/737 |
| 5,898,909 A | * | 4/1999 | Yoshihara ............. | H01L 23/552 257/E23.114 |
| 6,049,468 A | * | 4/2000 | Learmonth .......... | H05K 9/0022 174/370 |
| 6,068,358 A | * | 5/2000 | Rieger ..................... | H02B 1/38 16/392 |
| 6,512,681 B2 | * | 1/2003 | Uusimaki ............ | H05K 9/0022 174/350 |
| 6,570,772 B2 | * | 5/2003 | Kawano ............... | H05K 7/1461 174/363 |
| 6,915,956 B2 | * | 7/2005 | Liu ................... | G06K 19/07732 235/441 |
| 8,953,325 B2 | * | 2/2015 | Yu ........................ | H05K 7/2039 165/104.33 |

(Continued)

*Primary Examiner* — Xanthia C Cunningham
(74) *Attorney, Agent, or Firm* — Osha Liang LLP

(57) ABSTRACT

An electrical system includes an electrical module including a conductive plate, a casing having a bottom face mounted on a top face of the conductive plate while leaving at least a part of the top face revealed, a shielding including a body intended to at least partly cover the casing, and an electronic circuit board for controlling the components of the casing, intended to cover the shielding in order for the shielding to protect the electronic circuit board from the electromagnetic radiations emitted by the electrical components of the casing in their operation. The shielding further includes at least one tab made of a piece with the body of the shielding and extending downwards so as to come into contact with a respective revealed part.

10 Claims, 2 Drawing Sheets

(56) References Cited

U.S. PATENT DOCUMENTS

| | | | |
|---|---|---|---|
| 2002/0154474 A1* | 10/2002 | Merz | G02F 1/133308 361/679.55 |
| 2004/0231879 A1* | 11/2004 | Ebihara | H01L 23/552 174/521 |
| 2006/0259788 A1* | 11/2006 | Elbert | G06F 21/87 713/194 |
| 2007/0085108 A1* | 4/2007 | White | H01L 23/552 257/173 |
| 2009/0256244 A1* | 10/2009 | Liao | H01L 21/568 257/660 |
| 2009/0284913 A1* | 11/2009 | Wakabayashi | H04L 1/0083 361/679.54 |
| 2010/0188834 A1* | 7/2010 | Snider | H04B 1/082 361/818 |
| 2011/0032196 A1* | 2/2011 | Feng | G06F 3/045 345/173 |
| 2011/0115059 A1* | 5/2011 | Lee | H01L 21/561 257/659 |
| 2011/0298111 A1* | 12/2011 | Kim | H01L 21/561 257/660 |
| 2012/0140423 A1* | 6/2012 | Fisher, Jr. | H05K 3/284 361/748 |
| 2012/0280766 A1* | 11/2012 | Regnier | H01R 13/6469 333/185 |
| 2013/0016047 A1* | 1/2013 | Masumoto | G02F 1/13338 345/173 |
| 2013/0120957 A1* | 5/2013 | Werner | H05K 9/0032 361/818 |
| 2015/0016066 A1* | 1/2015 | Shimamura | H01L 23/3121 361/728 |
| 2015/0043170 A1* | 2/2015 | Shimamura | H01L 23/3121 361/728 |
| 2015/0116958 A1* | 4/2015 | Shedletsky | H05K 5/065 361/748 |

* cited by examiner

ELECTRICAL SYSTEM WITH SHIELDING

TECHNICAL FIELD

The present invention relates to the field of the electromagnetic shielding of electrical systems.

TECHNOLOGICAL BACKGROUND

It is known practice to control a power electrical module by means of an electronic circuit board arranged against the electrical module.

Now, the electrical module emits electromagnetic waves which risk disturbing the operation of the electronic circuit board.

To avoid this problem, it is known practice to arrange an electromagnetic shielding between the power electrical module and control electronic circuit board. The shielding is, for example, formed by a substantially planar metal sheet.

The module generally comprises a conductive plate forming an electrical ground for the electrical system. Thus, it may be necessary to connect the shielding (and the electronic circuit board) to the conductive plate to ensure a connection to the electrical ground. To this end, it is known practice to use rods mounted on and intended to extend from the electronic circuit board to the conductive plate, passing through the shielding.

The aim of the invention is to propose an electrical system with shielding of simplified design, while comprising a link, notably an electrical link, between the shielding and the conductive plate.

SUMMARY OF THE INVENTION

To this end, an electrical system is proposed comprising:
an electrical module comprising:
  a conductive plate having a top face,
  a casing having a bottom face mounted on the top face of the conductive plate while leaving at least a part of the top plate revealed,
  electrical components arranged in the casing,
an electromagnetic shielding comprising a body intended to at least partly cover the casing,
an electronic circuit board for controlling the components of the casing, intended to cover the shielding in order for the shielding to protect the electronic circuit board from the electromagnetic radiations emitted by the electrical components of the casing in their operation,
the electrical system being characterized in that the shielding further comprises at least one tab made of a piece with the body of the shielding and extending downwards so as to come into contact with a respective revealed part.

By virtue of the invention, the use of mounted rods is avoided for linking the shielding to the conductive plate. Thus, the electrical system has fewer parts which simplifies its design. Furthermore, the assembly is simplified since it no longer includes a rod mounting step.

Optionally, each tab comprises an end having a bottom face intended to be mounted against the revealed part.

Also optionally, the body and the tab or tabs are formed from one and the same sheet, by cutting and folding of this sheet.

Also optionally, the shielding further comprises at least one arm extending upwards from the body of the shielding and on which the electronic circuit board is intended to rest.

Also optionally, the arm or arms are also formed from the sheet, by cutting and folding of this sheet.

Also optionally, the casing further comprises, for each arm, a finger rising upwards, in particular towards the electronic circuit board, and on which the arm is intended to rest.

Also optionally, the electrical system further comprises an insulating sheet intended to be inserted between the shielding and the electronic circuit board.

Also optionally, the conductive plate forms an electrical ground of the electrical system.

Also optionally, for each revealed part of the conductive plate, the body of the shielding comprises an opening intended to be situated above this revealed part.

Also optionally, the electrical system further comprises:
a case comprising:
  a bottom having a top face against which the bottom face of the conductive plate is intended to be mounted,
  a cover provided, for each revealed part of the conductive plate, with a rod extending downwards and intended to pass into the opening of the shielding situated above this revealed part, the rod having a bottom end intended to be mounted against a top face of the tab of the shielding intended to come into contact with this revealed part.

In particular, the cover is intended to close the case.

DESCRIPTION OF THE FIGURES

Embodiments of the invention will now be described purely by way of example, with reference to the following figures.

DETAILED DESCRIPTION

Figure 1:
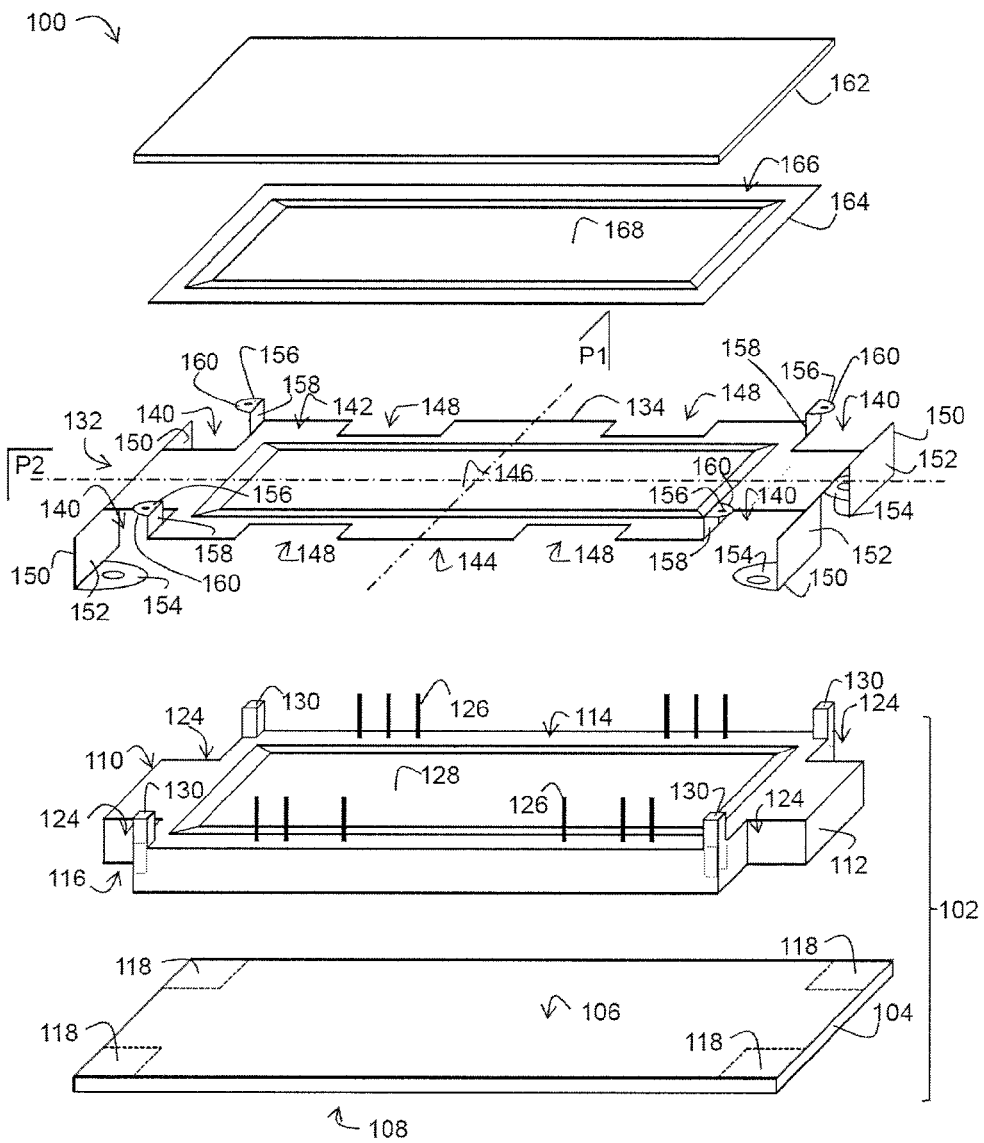
FIG. 1 is an exploded view of an electrical system according to the invention.
Figure 2:
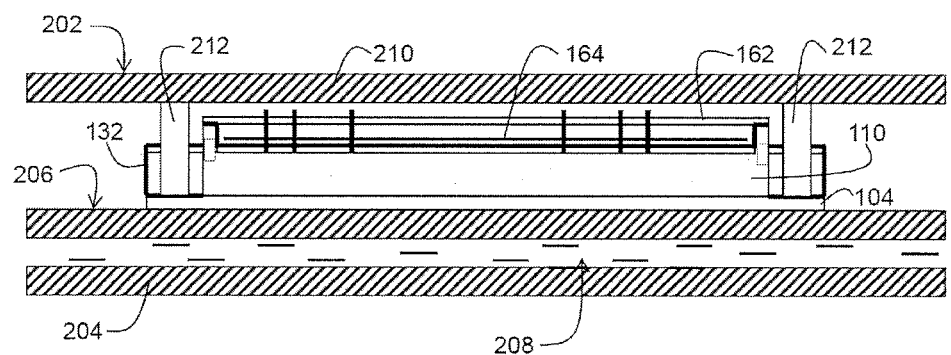
FIG. 2 is a side cross-sectional view of the electrical system of FIG. 1.

Referring to FIGS. 1 and 2, an electrical system 100 according to the invention will now be described.

Referring to FIG. 1, the electrical system 100 first of all comprises an electrical module 102. The electrical module is, for example, a power electrical module, that is to say one passed through by a current of 1 amp or more. The electrical system 100 is, for example, included in an inverter or, more generally, in a voltage converter.

The electrical module 102 firstly comprises a conductive plate 104 having a top face 106 and a bottom face 108. The conductive plate 104 is planar and rectangular, and has, for example, a thickness of between 1 and 5 millimeters. The conductive plate 104 is intended to form an electrical ground of the electrical system 100. The conductive plate 104 can be made of metal, for example of nickel or of copper.

The electrical module 102 further comprises an insulating casing 110 fixed to the conductive plate 104.

The casing 110 comprises a body 112 having a top face 114 and a bottom face 116 mounted on the top face 106 of the conductive plate 104. The casing 110 leaves at least a part 118 of the top face 106 revealed. These revealed parts 118 are therefore the part or parts of the top face 106 which are free of the casing 110.

In the example described, the body 112 of the casing 110 comprises a central part and two extensions on two opposite sides of the central part, so as to define four openings 124 leaving the four corners of the top face 106 of the conductive plate 104 revealed.

Electrical components (not represented) are arranged in the casing 110. In the example described, the casing 110 encloses the electrical components. These electrical components are connected to pins 126 exiting from the top face 114 of the casing 110 (in the interests of clarity, only two pins are referenced in FIG. 1). The electrical components are further connected to the conductive plate 104, in particular for a link to the ground. The electrical components are, for example, power components, that is to say components that can be passed through by currents of 1 amp or more.

An indentation 128 is further formed in the top face 114 of the casing 110.

The casing 110 further comprises at least one finger 130 extending upwards, that is to say towards the electronic circuit board 162 which will be described later, from the central part of the body 112 of the casing 110.

The electrical system 100 further comprises a shielding 132.

The shielding 132 comprises a flat body 134 intended to at least partly cover the top face 114 of the casing 110.

In the example described, the body 134 of the shielding 132 comprises, in a manner similar to the body 112 of the casing 110, a central part and two extensions on two opposite sides of the central part, so as to define, for each revealed part 118 of the top face 106 of the conductive plate 104, an opening 140 situated above this revealed part 118 (and therefore also above the opening 124 of the casing 110 for this revealed part 118).

The body 134 of the shielding 132 comprises a top face 142 and a bottom face 144 facing the top face 114 of the casing 110. An indentation 146 is formed in the top face 142 of the shielding 132. Cut-outs 148 are further formed in the central part of the body 134 of the shielding 132 to allow for the passage of the pins 126 of the casing 110.

The shielding 132 further comprises, for each revealed part 118 of the top face 106 of the conductive plate 104, a tab 150 made of a piece with the body 134 of the shielding 132 and extending downwards so as to come into contact with this revealed part 118. In the example described, each tab 150 comprises a vertical leg 152. Each tab 150 further comprises, at the bottom of the leg 152, that is to say in the distal portion of the leg 152 which is not linked to the body 134, an end 154 extending horizontally, that is to say parallel to the top face of the conductive plate 104, towards the central part of the body 134 of the shielding 132. The end 154 has a top face facing the opening 140 and a bottom face intended to be mounted against the revealed part 118. Moreover, a fixing hole is formed in the end 154.

The shielding 132 further comprises, for each finger 130 of the casing 110, an arm 156 extending upwards, that is to say towards the electronic circuit board 162 which will be described later, the arm 156 being made of a piece with the body 134 of the shielding 132 and intended to rest on the finger 130 of the casing 110. In the example described, each arm 156 comprises a vertical upright 158 and an end 160 extending horizontally, this end 160 having a bottom face intended to rest on the finger 130 of the associated casing 110, and a top face intended to receive an electronic circuit board.

In the example described, the body 134, the tabs 150 and the arms 156 of the shielding 124 are formed from one and the same sheet, by cutting and folding of this sheet. The sheet has, for example, a thickness of between 0.5 and 1 millimeter.

In particular, the leg 152 of each tab 150 is obtained by folding the end of one of the extensions of the body 134 of the shielding 132 and the end 154 is obtained by folding the bottom end of the leg 152.

The upright 158 of each arm 156 is obtained by folding a tongue attached to the central part of the body 134 of the shielding 132, and the end 160 of the arm 156 is obtained by folding the end of the upright 158.

The shielding 132 preferably has a planar symmetry relative to one or two of the front-rear P1 and right-left P2 vertical planes.

The electrical system 100 further comprises an electronic circuit board 162 for controlling the components of the casing 110. The electronic circuit board 162 is intended to rest on the arms 156 of the shielding 132 to cover the shielding 132. The pins 126 are intended to reach the electronic circuit board 162 to be connected to the electronic circuit board 162, in order to enable the electronic circuit board 162 to control the components of the casing 110 via the pins 126.

The shielding 132 protects the electronic circuit board 162 from the electromagnetic radiations emitted by the electrical components of the casing 110 in their operation. For example, the shielding makes it possible to reduce these electromagnetic radiations by 50% on the electronic circuit board 162. The shielding 132 is for example made of steel.

The electrical system 100 further comprises an insulating plate 164 inserted between the shielding 132 and the electronic circuit board 162. The insulating plate 164 is for example made of plastic material. The insulating plate 164 comprises a top face 166, oriented towards the electronic circuit board 162, in which an indentation 168 is formed.

Referring to FIG. 2, the electrical system 100 further comprises a case 202 comprising a bottom 204 having a top face 206 against which the bottom face 108 of the conductive plate 104 is mounted.

A duct 208 is formed in the bottom 204 of the case 202, in particular under the conductive plate 104. A coolant, such as water, is intended to pass through this duct to cool the bottom 204 of the case 202.

The case 202 further comprises a cover 210 provided, for each revealed part 118 of the top face 106 of the conductive plate 104, with a rod 212 extending downwards, that is to say towards the conductive plate 104, from a bottom face of the top wall 210. Each rod 212 is intended to pass alongside the electronic circuit board 162, then through the openings of the body of the shielding and of the casing situated above this revealed part 118. The rod 212 has a bottom end intended to be mounted against the top face of the tab mounted against this revealed part 118. The rod or rods 212 serve to keep the shielding 132 in place.

In the example described, each rod 212 is pierced in such a way as to form a sleeve intended to receive a screw through the top of the cover, the screw extending into the conductive plate and into the bottom of the case. Preferably, the conductive plate 104 is not drilled before the cover 210 is assembled on the conductive plate 104. In this case, a self-tapping screw can be used.

By virtue of the above invention, the mounting of the shielding is simplified because a single part is used for the shielding and for the connection to the electrical ground-forming conductive plate.

Moreover, the presence of the indentations 128, 146, 168 makes it possible to arrange large components on a bottom face of the electronic circuit board 162.

Moreover, the tabs 132 make it possible to connect the shielding to the conductive plate 104, and the arms 156 make it possible to connect the electronic circuit board 162 to the conductive plate 104 via the shielding 132. With the conductive plate 104 forming the electrical ground of the electrical system 100, a simple connection of the shielding 132 and of the electronic circuit board 162 to the electrical ground is produced.

The present invention is not limited to the embodiments described previously, but is, on the contrary, defined by the ensuing claims. It will in fact be obvious to a person skilled in the art that modifications can be made thereto.

Moreover, the terms used in the claims should not be understood to be limited to the elements of the embodiments described previously, but should, on the contrary, be understood to cover all the equivalent elements that a person skilled in the art can deduce from his or her general knowledge.

LIST OF REFERENCES 100 electrical system
102 electrical module
104 conductive plate
106 top face of the conductive plate 104
108 bottom face of the conductive plate 104
110 casing
112 body of the casing 110
114 top face of the casing 110
116 bottom face of the casing 110
118 revealed part of the conductive plate 104
124 openings of the casing 110
126 pins
128 indentation of the casing 110
130 fingers of the casing 110
132 shielding
134 body of the shielding 132
140 openings of the shielding 132
142 top face of the shielding 132
144 bottom face of the shielding 132
146 indentation of the shielding 132
148 cut-outs of the shielding 132
150 tabs of the shielding 132
152 legs of the tabs 150
154 ends of the tabs 150
156 arms of the shielding 132
158 uprights of the arms 156
160 ends of the arms
162 electronic circuit board
164 insulating plate
166 top face of the insulating plate 164
168 indentation of the insulating plate 164
202 case
204 bottom of the case 202
206 top face of the bottom 204
208 coolant duct
210 cover of the case 202
212 rods of the case 202

The invention claimed is:

1. An electrical system comprising:
   an electrical module comprising:
      a conductive plate having a top face (106),
      a casing having a bottom face mounted on the top face of the conductive plate while leaving at least a part of the top face revealed, and
      electrical components arranged in the casing;
   an electromagnetic shielding comprising a body at least partly covering the casing; and
   an electronic circuit board for controlling the components of the casing, intended to cover the shielding in order for the shielding to protect the electronic circuit board from the electromagnetic radiations emitted by the electrical components of the casing in their operation,
   wherein the shielding further comprises at least one tab made of a piece with the body of the shielding and extending downwards so as to come into contact with a respective revealed part.

2. The electrical system according to claim 1, wherein each tab comprises an end having a bottom face intended to be mounted against the revealed part.

3. The electrical system according to claim 1, wherein the body and the tab or tabs are formed from one and the same sheet, by cutting and folding of this sheet.

4. The electrical system according to claim 1, in which the shielding further comprises at least one arm extending upwards from the body of the shielding and on which the electronic circuit board is intended to rest.

5. The electrical system according to claim 3, wherein the arm or arms are also formed from the sheet, by cutting and folding of this sheet.

6. The electrical system according to claim 4, wherein the casing further comprises, for each arm, a finger rising upwards and on which the arm is intended to rest.

7. The electrical system according to claim 1, further comprising an insulating sheet intended to be inserted between the shielding and the electronic circuit board.

8. The electrical system according to claim 1, in which the conductive plate forms an electrical ground of the electrical system.

9. The electrical system according to claim 2, in which, for each revealed part of the conductive plate, the body of the shielding comprises an opening intended to be situated above this revealed part.

10. The electrical system according to claim 9, further comprising a case comprising:
   a bottom having a top face against which the bottom face of the conductive plate is intended to be mounted;
   a cover provided, for each revealed part of the conductive plate, with a rod extending downwards and intended to pass into the opening of the shielding situated above this revealed part, the rod having a bottom end intended to be mounted against a top face of the tab of the shielding intended to come into contact with this revealed part.

* * * * *